United States Patent
King et al.

(10) Patent No.: US 6,836,116 B2
(45) Date of Patent: Dec. 28, 2004

(54) SENSITIVITY ENCODING MAGNETIC RESONANCE IMAGING METHOD AND SYSTEM

(75) Inventors: Kevin F. King, New Berlin, WI (US); Elisabeth Angelos, Hartland, WI (US)

(73) Assignee: GE Medical Systems Global Technology Company, LLC., Waukesha, WI (US)

( * ) Notice: Subject to any disclaimer, the term of this patent is extended or adjusted under 35 U.S.C. 154(b) by 45 days.

(21) Appl. No.: 10/064,309

(22) Filed: Jul. 1, 2002

(65) Prior Publication Data

US 2004/0000906 A1 Jan. 1, 2004

(51) Int. Cl.$^7$ ................................................ G01V 3/00
(52) U.S. Cl. ...................................... 324/318; 324/322
(58) Field of Search ............................... 324/318, 322, 324/309, 307, 311, 312

(56) References Cited

U.S. PATENT DOCUMENTS 6,380,741 B1 * 4/2002 Hajmal et al. ............... 324/318
6,559,642 B2 * 5/2003 King .......................... 304/307

FOREIGN PATENT DOCUMENTS

EP          1 102 076 A2      5/2001
US    WO 03/032816 A2 *  10/2002

OTHER PUBLICATIONS

Charles A. McKenzie et al., "New Approaches to Self–Calibrating Parallel Imaging," Proc. Intl. Soc. Mag. Reson. Med 9 (2001), p. 7.

Klaas P. Pruessmann, et al., "SENSE: Sensitivity Encoding for Fast MRI," Magnetic Resonance in Medicine vol. 42, pp. 952–962.

* cited by examiner

Primary Examiner—Brij B. Shrivastav
(74) Attorney, Agent, or Firm—Fletcher Yoder

(57) ABSTRACT

A method and apparatus are disclosed for deriving an enhanced sensitivity matrix for describing coil sensitivity in a magnetic resonance imaging system. The enhanced sensitivity matrix provides sensitivity information for pixels near the edge of the imaged object such that pixels near the edge for which there was no sensitivity information are associated with a derived sensitivity. Likewise pixels near the edge for which there is measured sensitivity information are instead associated with a derived sensitivity to offset deficient sensitivity measurements near the edge of the object.

38 Claims, 4 Drawing Sheets

SENSITIVITY ENCODING MAGNETIC RESONANCE IMAGING METHOD AND SYSTEM

BACKGROUND OF THE INVENTION

The present invention relates generally to the field of medical imaging. More particularly, the invention relates to magnetic resonance imaging and to the calculation of receive coil sensitivities.

In the field of medical magnetic resonance imaging, the patient is placed within a spatially uniform magnetic field ($B_0$). The individual magnetic moments of the spins in the tissue generally align with this polarizing field, precessing about it in a random manner dependent on their characteristic Larmor frequency. Gradient magnetic fields are employed which, within the three-dimensional imaging volume, impute characteristic magnetic field differences with the $B_0$ field. The patient tissue is then subjected to an rf excitation pulse ($B_1$) which is near the Larmor frequency and which is perpendicular to the $B_0$ field, to rotate or "tip" the spins into the plane transverse to the $B_0$ field to produce a net transverse magnetic moment. Once the rf excitation pulse is terminated, the spins realign with the $B_0$ field and, in doing so, emit a magnetic resonance signal, which may be localized by means of the gradient magnetic fields, and which can be detected and processed via Fourier transformation to form an image. The rf signals are typically applied by a "transmit" coil and resulting signals are detected by a "receive" coil. In certain systems these functions are combined in a single coil or coil set. The magnetic resonance signals are acquired as a voltage induced in the receive coils within the imaging system.

The duration of the scan time is determined, in part, by the number of phase encoding steps performed, which is itself dependent upon the desired image size and image resolution. To produce diagnostic quality images, magnetic resonance imaging techniques typically require many minutes to acquire the imaging data. Reduction of scan time is therefore a desirable goal in order to improve patient comfort, increase patient throughput, and reduce image artifacts resulting from inadvertent patient movement.

One technique for reducing image acquisition time is to reduce the number of phase-encode steps, such as by keeping the same phase-encode gradients but only collecting every other column of data, thereby halving the collection time. The spacing of the data points in the phase-encode direction is thus doubled, so that the field of view in the corresponding image domain is effectively halved. Unfortunately, resonance signals from outside the reduced field of view are still detected by the receive coils and are "folded" back upon the image, or aliased, such that an aliased pixel represents intensity data for more than one point within the imaging volume. Such aliasing is thus undesirable in that it adversely affects image quality.

One technique for canceling these unwanted signals is commonly referred to as sensitivity encoding, or SENSE, which utilizes the spatial sensitivity profile in a multiple receive coil system to determine signal position information within the region of interest. The SENSE reconstruction of these multiple receive coil signals enables aliasing to be reduced, i.e., the aliased image is "unfolded," using the respective sensitivity information for each receive coil. In particular, the sensitivity information for each coil is a complex function which describes the coil's response to resonance signals originating from different points in the imaging volume. Use of this information allows the removal of aliasing effects. In this manner, a full image may be produced though the acquisition time is only that required to obtain a reduced field of view image, i.e., the acquisition time may be halved.

To obtain the necessary sensitivity information, a calibration scan is performed in addition to the diagnostic scan. Because the ultimate goal is to reduce the system scan time, this calibration scan should be as rapid as possible. The calibration scan time may be shortened by reducing the spatial resolution of the scan. Unfortunately, the reduced resolution produces an inaccurate assessment of coil sensitivities near the edges of the object which can prevent the removal of some aliasing artifacts. Another problem is that inadvertent patient motion (e.g., breathing) or a change in position (e.g., no or relatively small breathholding volume during calibration and larger breathholding volume during imaging) between the diagnostic and calibration scans may result in some areas which are not imaged during the calibration scan but which are imaged during the diagnostic scan. Because of the absence of a signal in these areas during the calibration scan, no coil sensitivity information is available to remove the aliasing artifacts from these areas.

There is a need, therefore, for an improved technique for obtaining coil sensitivity information during calibration scans when the SENSE technique is employed. To address the drawbacks in existing systems, there is a particular need for a technique which can be employed in a straightforward manner to allow the accurate estimation of coil sensitivities near object edges and in pixels with no measurable sensitivity, i.e., "empty" pixels. The present invention is directed to overcoming, or at least reducing the effects of one or more of the problems set forth above.

SUMMARY OF THE INVENTION

The invention provides a novel technique for constructing a coil sensitivity matrix for the receive coils of a magnetic resonance imaging system. The technique utilizes a derived sensitivity function to approximate coil sensitivity near the edges of an object. In this manner, a modified receive coil sensitivity matrix may be determined which allows a diagnostic image to be corrected for aliasing artifacts.

The determination of the sensitivity matrix is performed by performing a calibration scan at reduced resolution. The data from the scan is processed to form a calibration image. Within each column of the image, the edges of the imaged object are located and a sensitivity function for each edge is derived based upon a number of pixels located inward of the edge. The sensitivity function typically comprises a linear extrapolation though other statistical fit models may be used. Based upon this mathematical model, an estimation can be made of the actual sensitivity of those pixels near the edge of the object. In this manner, the sensitivity values of the pixels inward of the object edge, which are subject to inaccuracy due to their proximity to the edge, may be replaced with the respective calculated sensitivity values. In addition, a calculated sensitivity may be assigned to pixels outward from the object edge for which no sensitivity may be measured due to lack of a resonance signal.

In accordance with one aspect of the technique, a method is provided for estimating coil sensitivities in a magnetic imaging system. Within a magnetic resonance image, an edge pixel is located within the columns or rows of an image. A sensitivity function is calculated which describes coil sensitivity for that edge pixel. The sensitivity function is calculated using two or more fitting pixels inward of the edge pixel.

In accordance with another aspect of the technique, a method is provided for generating an enhanced sensitivity matrix for an object. An initial calibration image of the object is first obtained. Object edges within the columns or rows of the calibration image are then located which comprise object edge pixels. A sensitivity function for each object edge is then calculated using two or more fitting pixels located inward of the object edge pixels. Respective sensitivity values are then derived from the sensitivity function and assigned to each of one or more pixels located outward from the object edge pixels.

In accordance with another aspect of the technique, magnetic resonance imaging system capable of estimating coil sensitivity is provided. The magnetic resonance imaging system comprises a magnetic resonance scanner capable of generating a calibration image. In addition, the system comprises an analysis circuit capable of receiving the calibration image from the scanner. The analysis circuit processes the image by locating edge pixels within columns or rows of the image and by calculating a sensitivity function from two or more fitting pixels disposed inward of the edge pixels. The sensitivity function describes coil sensitivity near the edge pixels.

In accordance with another aspect of the technique, a magnetic resonance imaging system is provided capable of generating an enhanced sensitivity matrix for a subject. The system comprises a magnetic resonance scanner capable of generating a calibration image. In addition, the system comprises an analysis circuit capable of receiving the calibration image. The analysis circuit calculates a sensitivity function from two or more fitting pixels disposed inward of edge pixels. This sensitivity function describes coil sensitivity near the edge pixels. The analysis circuit further assigns a respective calculated sensitivity derived from the sensitivity function to each of one or more pixels disposed outward from the edge pixels.

In accordance with another aspect of the technique, a magnetic resonance imaging system is provided capable of generating an optimized image of a subject. The system comprises a magnetic resonance scanner capable of generating a diagnostic image and a calibration image and an analysis circuit capable of receiving the diagnostic image and the calibration image. The analysis circuit comprises a means for generating an enhanced sensitivity matrix using the calibration image. The analysis circuit optimizes the diagnostic image using the enhanced sensitivity matrix to generate an optimized diagnostic image. The system further comprises a display circuit capable of receiving the optimized diagnostic image and transmitting the optimized diagnostic image to a suitable display device.

BRIEF DESCRIPTION OF THE DRAWINGS

The foregoing and other advantages and features of the invention will become apparent upon reading the following detailed description and upon reference to the drawings in which.

DETAILED DESCRIPTION

Figure 1:
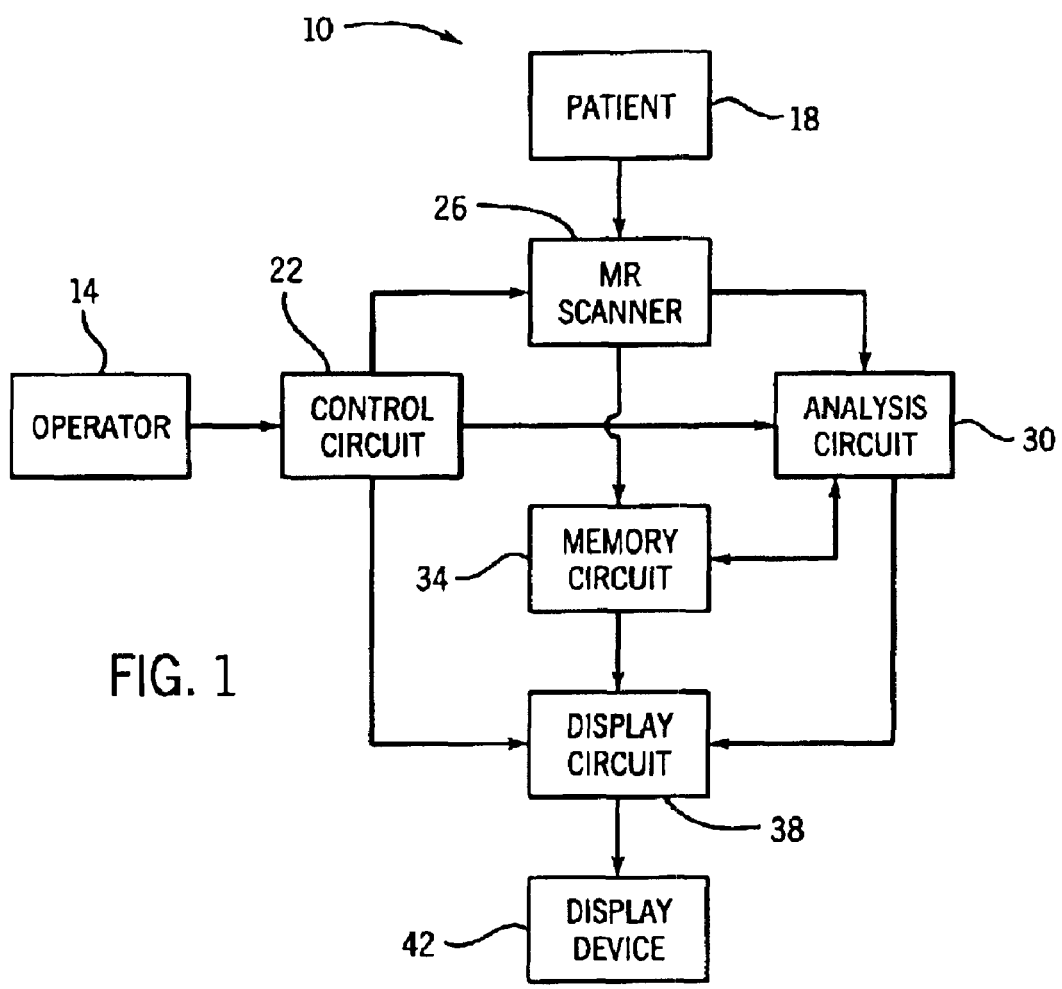
FIG. 1 is a diagrammatical representation of a magnetic resonance imaging system adapted to estimate receive coil sensitivities.

Turning now to the drawings and referring initially to FIG. 1, there is depicted a diagrammatical representation of a magnetic resonance system 10 and its constituent components. An operator 14 employs the MR system 10 to perform imaging operations upon a patient 18. The operator 14 performs these operations via a control circuit 22 which controls the operations performed by such constituent components as an MR scanner 26, an analysis circuit 30, and a display circuit 38. Certain utilitarian functions of the memory circuit 34 may also be controlled by the control circuit 22 but, for purposes of this discussion, the operation of the memory circuit 34 will be presumed to be responsive to the needs of the other component circuits.

The operator 14 performs the imaging operations on the patient 18 by instructing the MR scanner 26 to execute a series of radio frequency (rf) pulses according to both automated routines and variables configured at the control circuit 22. The MR scanner 26 collects signals resulting from these rf pulses which is then passed either directly to the analysis circuit 30 or to the memory circuit 34 and which will subsequently provide the data to the analysis circuit 30. The analysis circuit 30 applies analytical routines on the data in accordance with the parameters set by the operator 14 at the control circuit 22 to produce image data. The image data is, in turn, passed either to the memory circuit 34 for later display or directly to the display circuit 38 for immediate display in accordance with instructions received from the operator 14 via the control circuit 22. The display circuit 38 then displays the data on a display device 42, such as a monitor or printer, for review by the operator or appropriate medical personnel. The specific configuration and operation of the system may, of course, differ from this general arrangement.

The magnetic resonance system 10 may utilize a technique such as sensitivity encoding (hereinafter "the SENSE technique") to reduce image acquisition time. The SENSE technique utilizes multiple rf surface coil arrays within the MR scanner 26, and reduces image acquisition time by increasing the step size between phase encoding lines because the scan time is generally dependent upon the number of phase encode lines acquired. Increasing the step size, however, effectively reduces the field of view of the MR scanner 26 because the field of view is determined by the distance between the phase encode lines. If the object being imaged extends outside of this reduced field of view, aliasing errors, i.e. wrap-around errors, may be present in the phase-encoding direction. The SENSE technique removes aliasing by relying upon the respective surface coil sensitivities to find the unaliased spin distributions. Successful removal of the aliasing therefore depends on an accurate determination of the various coil sensitivities.

The SENSE technique therefore utilizes a calibration scan to determine a sensitivity matrix from which the various coil sensitivities may be determined. Because a purpose of utilizing the SENSE technique is to minimize image acquisition time, it is likewise desirable to minimize the calibration scan time. Calibration scan time may be reduced by reducing the spatial resolution of the calibration scan. In this manner, the calibration scan covers a subset of the object to be imaged which includes the full volume of the diagnostic scan subject. This reduced resolution, however, leads to an inaccurate measurement of the coil sensitivities near edges of the object, which can subsequently impair the removal of aliasing errors.

Figure 2:
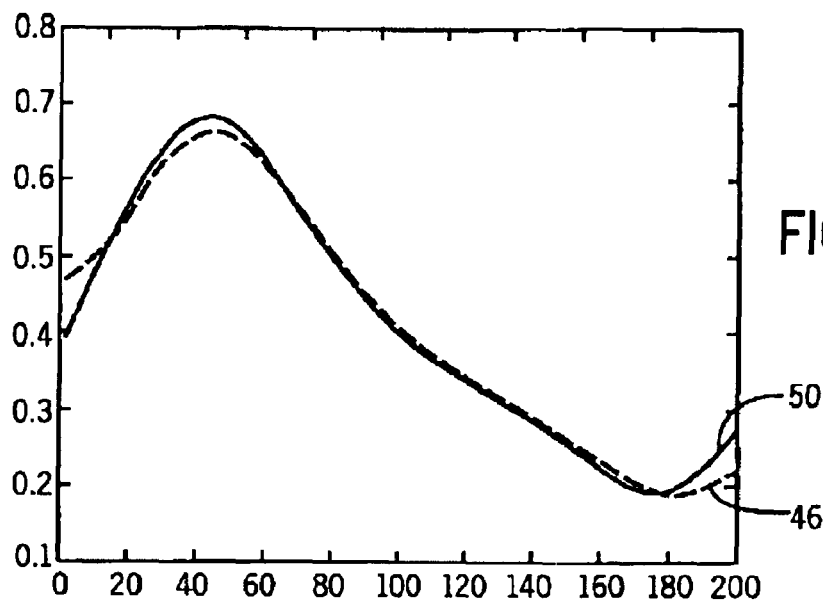
FIG. 2 is a line graph depicting a sensitivity function for both a column of a high-resolution image and column of a low-resolution magnetic resonance image.

An example of this edge-effect is depicted in FIG. 2. FIG. 2 charts the magnitude of the sensitivity in a column of a digital image using a four-element linear coil array. The sensitivity by pixel is charted for both a low-resolution, 32×32 matrix, represented as dashed line 46, and a high resolution, 256×256 matrix, represented as solid line 50. Sensitivity along the Y-axis is normalized to be dimensionless. The X-axis represents a column of 200 pixels in a digital image of a phantom object with the edges of the phantom at 0 and 200. As is evident from FIG. 2, the sensitivities of the low-resolution image 46 and the high-resolution image 50 track well except near the edges of the object where they can be seen to diverge. This discrepancy between in the measured coil sensitivity near the edges of low-resolution image 46 and high-resolution image 50 can impair the correction of aliasing errors.

Additionally, in actual practice both the calibration scan as well as the diagnostic scan may require the patient to hold her breath to minimize respiratory motion artifacts. However, if the patient or the coil move in the phase encoding direction between the calibration scan and the diagnostic scan, such as due to the patient taking a deeper or shallower breath for the second scan, uncorrectable aliasing artifacts may result due to the inconsistency between the edges of the two scans (i.e., due to a change in edge location of the chest or due to the failure to collect sensitivity data).

Figure 3:
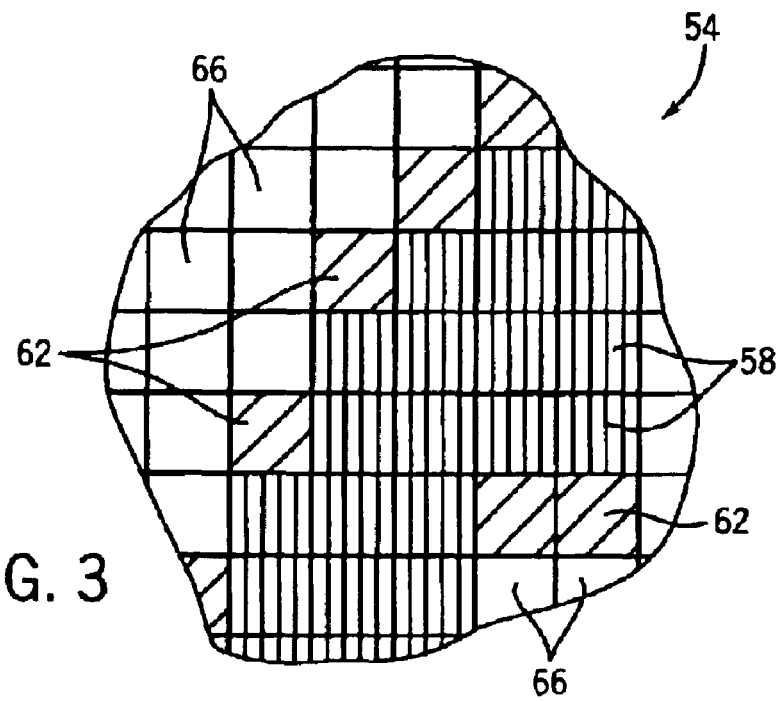
FIG. 3 is a portion of a pixel matrix of a diagnostic image.
Figure 4:
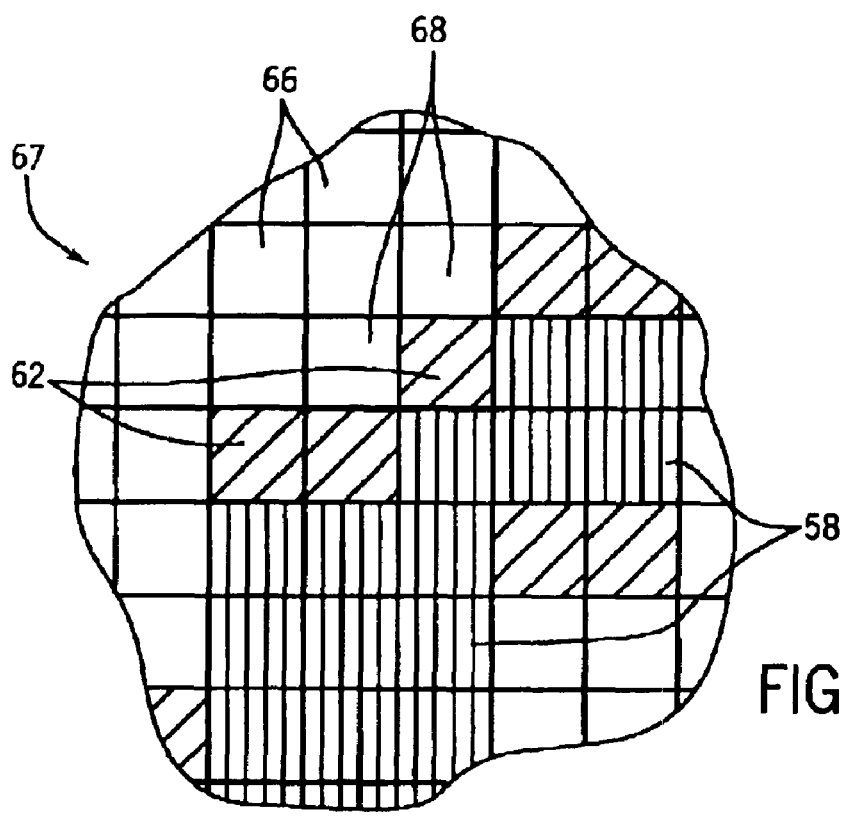
FIG. 4 is a portion of the a pixel matrix of a calibration image.

The basis for this result is depicted in FIGS. 3 and 4. FIG. 3 depicts a portion of a diagnostic image pixel matrix 54 comprising a plurality of pixels. Interior pixels 58, shaded with vertical lines, and edge pixels 62, shaded with diagonal lines, represent those pixels representative of the imaged object. The edge pixels 62 are defined in terms of some threshold intensity value such that, within a column or row, the intensity of the edge pixel 62 exceeds the threshold intensity value while the intensity value of an adjacent pixel within the column, such as exterior pixels 66, does not exceed the threshold intensity value. Other definitions may equally well apply such as dependence upon differences in intensity between neighboring pixel valves. Similarly, the interior pixels 58 are defined as those pixels within a column whose intensity value exceeds the threshold intensity value and which are adjacent to two other pixels within the column which have intensity values greater than the threshold intensity value, i.e. other interior pixels 58 or an edge pixel 62. Exterior pixels 66 are those pixels with intensity values less than the threshold intensity value.

Within a column of imaging pixels there will generally be an upper and a lower edge pixel 62, assuming edges of the object of interest are within the image. For the sake of discussion, the interior pixels 58 can be described as those pixels within a column or row between the upper and lower edge pixels 62, i.e. inward of the edge pixels. Similarly, the exterior pixels 66 can be described as those pixels outward from the upper and lower edge pixels 62 within a column or row.

Referring now to FIG. 4, a portion of a calibration image pixel matrix 67 depicting the same region as in FIG. 3 is illustrated. Due to patient motion or to the patient holding her breath differently between the calibration and the diagnostic scans, some pixels are interior pixels in the calibration image which are not interior pixels in the diagnostic pixel matrix 54. In addition, vacated pixels 68 may be present in the calibration image and represent those pixels which are below the intensity threshold value during the calibration scan, i.e., outside the subject, but are greater than or equal to the threshold intensity value during the diagnostic scan, i.e., within the subject. The vacated pixels 68 are significant for the SENSE technique because coil sensitivity can only be measured inside the object boundaries, the signal outside the boundaries being too low to accurately measure sensitivity. Therefore, vacated pixels 68 provide no coil sensitivity information during the calibration scan for pixels which are potentially inside the object boundaries during the diagnostic scan. Uncorrectable aliasing results where a signal in the diagnostic scan originates from an area where the sensitivity has not been measured during the calibration scan.

Figure 5:
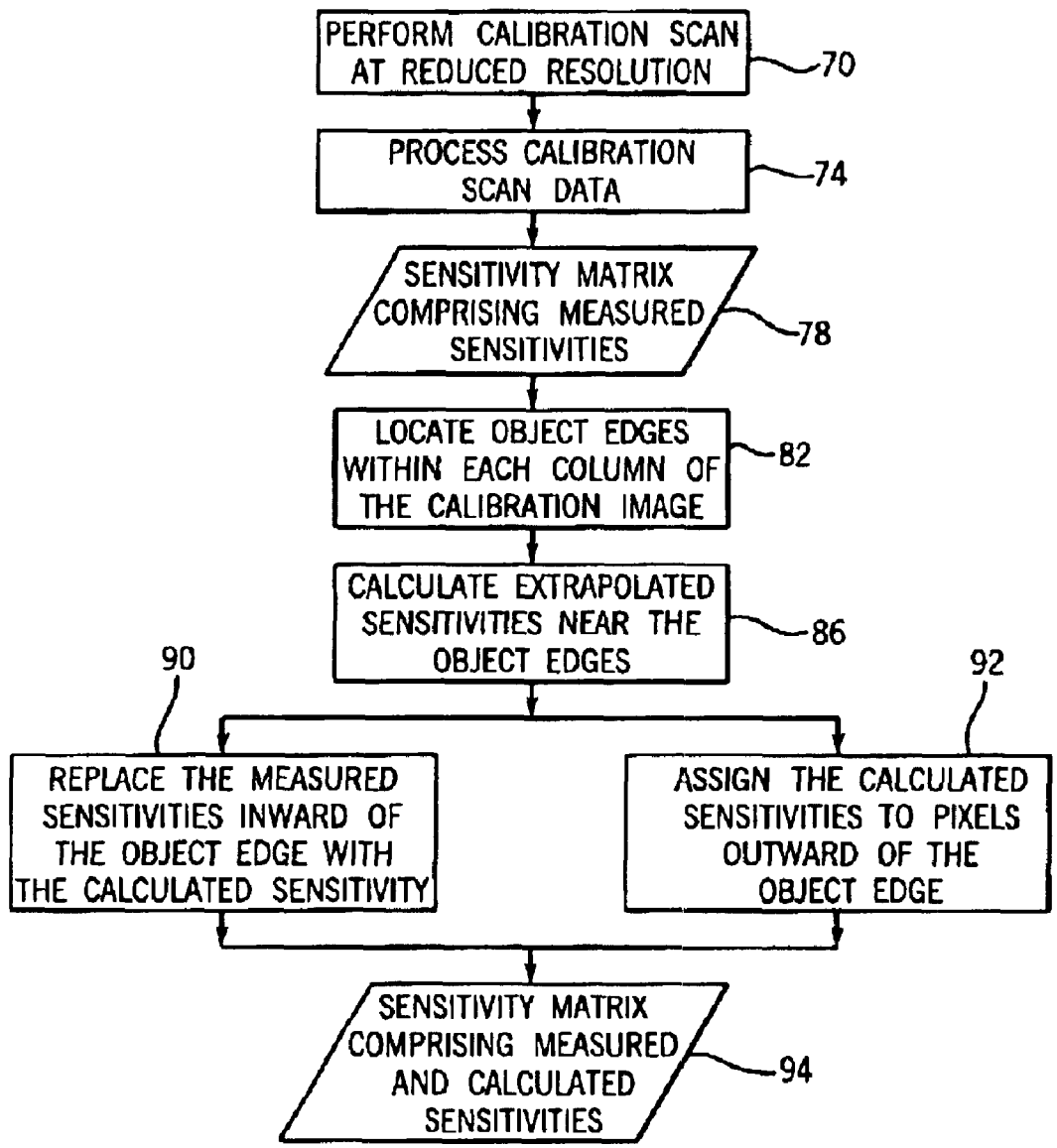
FIG. 5 is a flow chart illustrating the steps of creating an enhanced sensitivity matrix.

The present technique addresses both the problem of inaccurate measurement of coil sensitivity near the object edge and the problem of absent coil sensitivity measurement during calibration as a result of patient motion between scans, while maintaining a short calibration time. Referring now to FIG. 5, a flow chart depicting a method associated with aspects of present technique is presented. A calibration scan is first performed, as depicted in block 70. Typically the calibration scan is carried out at a reduced resolution by MR scanner 26. The data acquired by the calibration scan is then processed by analysis circuit 38, as depicted in block 74. Data processing may include such steps as zero-padding the image data in k-space to increase the spatial resolution of the calibration image as well as performing a two-dimensional fast Fourier Transformation on the image data to produce the low-resolution calibration image. The pixels of the calibration image each have an associated measured sensitivity, which determine a sensitivity matrix, as depicted in block 78.

The sensitivity is a smoothly varying function in space which, over short distances, may be approximated as a linear function. Such an approximation is used to address the problems of inaccurate sensitivity measurement near the object edges and of vacated pixels which cannot provide sensitivity information for object pixels within the diagnostic image.

In particular, each edge pixel within each column of the calibration image is located, as depicted in block 82. Location of the edge pixels 62 may occur by various means, but typically will be accomplished by comparison of the intensities of the pixels within a column to some threshold intensity value and/or with values of neighboring pixels. For example, the top edge pixel 62 in a column is that pixel with an intensity value equal to or greater than the threshold value, and which is beneath, or inward to, a pixel with an intensity value less than the threshold intensity value. The bottom edge pixel 62 is located in a similar manner.

Next, a sensitivity function is constructed to calculate sensitivities of the pixels near the edge pixel 62. In one embodiment of the present technique, sensitivities are calculated for pixels near the edge pixel by extrapolating these sensitivities from the measured sensitivities of other inward pixels, as depicted in block 86 in FIG. 5. Typically, a linear extrapolation is used, although others techniques could be employed. Because the sensitivity is a complex function, the real and the imaginary components are extrapolated separately. Those skilled in the art will realize that, though the separate linear extrapolations of the real and imaginary components of a complex number will both be linear, the subsequent recombination of these extrapolations may yield a curved or parabolic line. Therefore, though the term linear extrapolation may be used, the complex nature of sensitivity may yield a curvilinear result to a linear extrapolation.

Due to the inaccuracy in the measured sensitivities near the edge, pixels further inward, which do not suffer from these inaccuracies, are preferred as the basis for the extrapolation. For example, depending upon the image matrix dimensions, a spacer region of five to twenty pixels may exist between the edge pixel 62 and the pixels which serve as the basis for fitting the extrapolation. This spacer region represents the span suffering from the severest inaccuracy in measuring the sensitivity due to the edge effects and is typically assumed to be ten pixels inward of the edge pixel 62 in a present implementation. Pixels two to five pixels inward of the spacer region are used to fit the extrapolation. In a present implementation, the three pixels inward of the spacer are used to fit the extrapolation.

The calculated sensitivity values may then be used for compensation or correction of either or both of the inaccuracy in measuring near edge coil sensitivity and the absence of sensitivity measurements outside the object area, i.e., outward of the edge pixel 62. These corrections are depicted, respectively, in blocks 90 and 92 in FIG. 5. In particular, block 90 depicts the process of replacing the measured sensitivity of the edge pixel 62 and nearby inward pixels with the calculated sensitivity described above. Referring once again to FIG. 2, if the object edges are located at pixels 0 and 200 along the X-axis, the measured sensitivities of some subset of pixels 0 to 20 or 180 to 200 of the calibration image 46 might be replaced with the extrapolated sensitivity values. Typically the measured sensitivities of the pixels comprising the spacer region and the edge pixel 62 are replaced. In this manner, a small group of pixels are used to fit an outward extrapolation of sensitivity, and all measured sensitivities outward of these fitting pixels are replaced with the calculated sensitivity up to the object edge. The inaccurate sensitivities near the edge are thereby replaced with calculated sensitivities based upon the more accurate sensitivity measurements.

In addition, the calculated sensitivities may be associated with pixels outward from the edge pixel 62 which possess no measured sensitivity due to the absence of a measurable signal, as depicted at block 92. In this manner, the effects of patient movement between the diagnostic scan and the calibration scan may be mitigated, at least within the extrapolated region. While any range of pixels outward from the edge pixel 62 might be assigned a sensitivity in this manner, in one embodiment of the present technique, the fifteen pixels outward from the edge pixel 62 are assigned an extrapolated sensitivity. The result of the processes depicted in blocks 90 and 92 is a composite sensitivity matrix 94 comprising both measured and calculated sensitivities.

Figure 6:
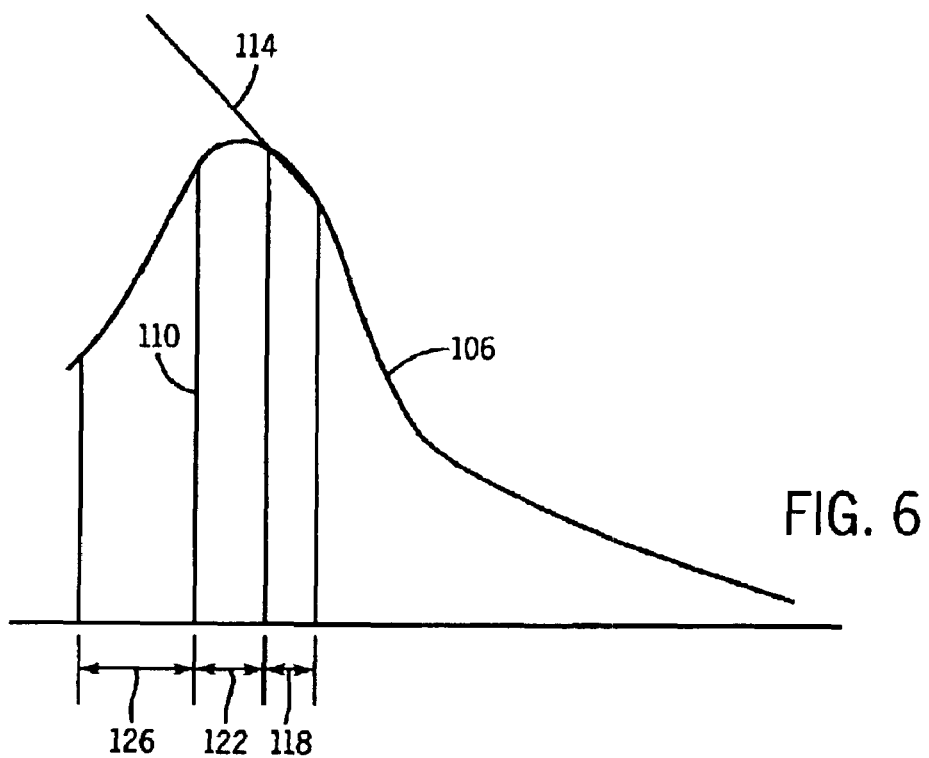
FIG. 6 is a line diagram depicting a sensitivity function for a column including an extrapolated sensitivity based upon a derived sensitivity function.

The result of these processes is depicted in FIG. 6, in which a sensitivity curve near an image edge is presented with the addition of an extrapolated sensitivity line. For the sake of simplicity, correction has only been performed on one edge of the represented sensitivity curve. The measured sensitivity line 106 depicts the actual measured sensitivity. The edge 110 represents the location of the edge of the imaged object. The extrapolated sensitivity line 114 represents the calculated sensitivity based upon the pixels within the fit region 118. As discussed above, in a present implementation fit region 118 typically comprises three pixels. Spacer region 122 represents a span of pixels, typically ten in a present implementation, disposed between the edge 110 and the fit region 118 in which the measured sensitivity is increasingly inaccurate near the edge due to the reduced spatial resolution of the calibration scan. In addition, an outer region 126 represents a span of pixels, typically fifteen in a present implementation, outward from the edge, for which there is no meaningful measured sensitivity, but which might benefit from an assigned sensitivity value to reduce the effects of patient movement. The extrapolated sensitivity line 114 covers both the spacer region 122 and the outer region 126, and provides meaningful sensitivity values within these regions.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A magnetic resonance imaging system capable of generating an optimized image for a subject, the system comprising:
   a magnetic resonance scanner capable of generating a diagnostic image and a calibration image;
   an analysis circuit capable of receiving the diagnostic image and the calibration image, the analysis circuit comprising a means for generating an enhanced sensitivity matrix using the calibration image, wherein the analysis circuit corrects the diagnostic image using the enhanced sensitivity matrix to generate a corrected diagnostic image; and
   a display circuit capable of receiving the corrected diagnostic image and transmitting the corrected diagnostic image to a suitable display device.

2. The magnetic resonance imaging system of claim 1, wherein the calibration image is a low-resolution image.

3. A magnetic resonance imaging system capable of generating an enhanced sensitivity matrix for a subject, the system comprising:
   a magnetic resonance scanner capable of generating a calibration image; and
   an analysis circuit capable of processing the calibration image by locating an edge pixel within columns or rows of the calibration image; of calculating a sensitivity function from two or more fitting pixels disposed inward of the edge pixel, wherein the sensitivity function describes coil sensitivity near the edge pixel, and of assigning a respective calculated sensitivity derived from the sensitivity function to each of one or more outer pixels disposed outward from the edge pixel.

4. The magnetic resonance imaging system of claim 3, wherein the analysis circuit locates the edge pixel based upon a threshold intensity value.

5. The magnetic resonance imaging system of claim 3, wherein the calibration image is a low-resolution image.

6. The magnetic resonance imaging system of claim 3, wherein the analysis circuit calculates the sensitivity function by extrapolating from two or more measured sensitivities of the respective two or more fitting pixels.

7. The magnetic resonance imaging system of claim 6, wherein the extrapolation is linear.

8. The magnetic resonance imaging system of claim 3, wherein a spacing distance comprising one or more spacing pixels is disposed between the two or more fitting pixels and the edge pixel.

9. The magnetic resonance imaging system of claim 8, wherein the analysis circuit further processes the image by replacing a measured sensitivity associated with each of the one or more spacing pixels and the edge pixel with the respective calculated sensitivity derived from the sensitivity function.

10. A magnetic resonance imaging system capable of estimating coil sensitivities, the system comprising:
- a magnetic resonance scanner capable of generating a calibration image; and
- an analysis circuit capable of processing the calibration image by locating an edge pixel within columns or rows of the calibration image and of calculating a sensitivity function from two or more fitting pixels disposed inward of the edge pixel, wherein the sensitivity function describes coil sensitivities near the edge pixel.

11. The magnetic resonance imaging system of claim 10, wherein the analysis circuit locates the edge pixel based upon a threshold intensity value.

12. The magnetic resonance imaging system of claim 10, wherein the calibration image is a low-resolution image.

13. The magnetic resonance imaging system of claim 10, wherein the analysis circuit calculates the sensitivity function by extrapolating from two or more measured sensitivities of the respective two or more fitting pixels.

14. The magnetic resonance imaging system of claim 13, wherein the extrapolation is linear.

15. The magnetic resonance imaging system of claim 10, wherein a spacing distance comprising one or more spacing pixels is disposed between the two or more fitting pixels and the edge pixel.

16. The magnetic resonance imaging system of claim 15, wherein the analysis circuit further processes the image by replacing a measured sensitivity associated with each of the one or more spacing pixels and the edge pixel with a respective calculated sensitivity derived from the sensitivity function.

17. The magnetic resonance imaging system of claim 10, wherein the analysis circuit further processes the image by assigning a respective calculated sensitivity derived from the sensitivity function to each of one or more outer pixels disposed outward from the edge pixel.

18. A method for generating an enhanced sensitivity matrix for an object comprising:
- obtaining an initial calibration image of the object;
- locating at least one object edge within one or more columns or rows of the calibration image, wherein the object edge comprises an object edge pixel;
- calculating a sensitivity function for each object edge based upon the measured sensitivity of two or more fitting pixels located inward of the object edge pixel; and
- assigning a respective sensitivity value derived from the sensitivity function to each of one or more outer pixels located outward from the object edge pixel.

19. The method of claim 18, wherein obtaining the initial calibration image comprises scanning a subject at reduced resolution.

20. The method of claim 18, wherein each object edge is determined based upon a threshold intensity value such that an intensity value of the object edge pixel equals or exceeds the threshold intensity value while a pixel adjacent to and outward of the object edge pixel does not exceed the threshold intensity value.

21. The method of claim 18, wherein calculating the sensitivity function comprises extrapolating from the measured sensitivity of the two or more fitting pixels.

22. The method of claim 21, wherein the extrapolation is linear.

23. The method of claim 21, wherein the two or more fitting pixels comprises three fitting pixels.

24. The method of claim 21, wherein a spacer region comprising one or more spacer pixels separates the respective object edge pixel and the two or more fitting pixels.

25. The method of claim 24, wherein the spacer region comprises 10 spacer pixels.

26. The method of claim 24, wherein a measured sensitivity value for each of the one or more spacer pixels and for the object edge pixel is replaced by a respective calculated sensitivity value derived from the extrapolation.

27. The method of claim 18, further comprising replacing a measured sensitivity value of each of one or more spacer pixels disposed between the object edge pixel and the two or more fitting pixels with a respective calculated sensitivity value derived from the sensitivity function.

28. The method of claim 18, wherein the one or more outer pixels comprises fifteen pixels.

29. A method for estimating coil sensitivities in a magnetic resonance imaging system comprising:
- locating an edge pixel within one or more columns or rows of a magnetic resonance image; and
- calculating a sensitivity function describing coil sensitivity for the edge pixel based upon two or more fitting pixels inward of the edge pixel.

30. The method of claim 29, wherein the edge pixel is located based upon a threshold intensity value such that an intensity value of the edge pixel equals or exceeds the threshold intensity value and an intensity value of a pixel adjacent and outward from the edge pixel does not exceed the threshold intensity value.

31. The method of claim 29, wherein the magnetic resonance image is a low-resolution image.

32. The method of claim 31, wherein the low-resolution image is a calibration image.

33. The method of claim 29, wherein the sensitivity function is a linear extrapolation.

34. The method of claim 33, wherein a spacing distance comprising one or more spacing pixels separates the two or more fitting pixels and the edge pixel.

35. The method of claim 34, wherein the spacing distance comprises ten spacing pixels and the two or more fitting pixels comprises three fitting pixels.

36. The method of claim 34, further comprising replacing a measured sensitivity associated with each of the one or more spacing pixels and the edge pixel with a respective calculated sensitivity derived from the linear extrapolation.

37. The method of claim 33, further comprising assigning a respective extrapolated sensitivity to each of one or more outer pixels disposed outward from the edge pixel.

38. The method of claim 37, wherein the one or more outer pixels comprises fifteen outer pixels.

* * * * *